(12) United States Patent
Kao et al.

(10) Patent No.: US 11,349,485 B2
(45) Date of Patent: May 31, 2022

(54) CLOCK AND DATA RECOVERY AND ASSOCIATED SIGNAL PROCESSING METHOD

(71) Applicant: MEDIATEK INC., Hsin-Chu (TW)

(72) Inventors: Chien-Kai Kao, Hsinchu (TW);
Tse-Hsien Yeh, Hsinchu (TW);
Shih-Che Hung, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 16/744,188

(22) Filed: Jan. 16, 2020

(65) Prior Publication Data

US 2020/0244272 A1 Jul. 30, 2020

Related U.S. Application Data

(60) Provisional application No. 62/797,434, filed on Jan. 28, 2019.

(51) Int. Cl.
*H03L 7/08* (2006.01)
*H03L 7/081* (2006.01)
*H03L 7/087* (2006.01)
*H04L 7/02* (2006.01)

(52) U.S. Cl.
CPC ............ *H03L 7/0807* (2013.01); *H03L 7/081* (2013.01); *H03L 7/087* (2013.01); *H04L 7/02* (2013.01)

(58) Field of Classification Search
CPC ....... H03L 7/0807; H03L 7/081; H03L 7/087; H04L 7/02
See application file for complete search history.

(56) References Cited

U.S. PATENT DOCUMENTS

| | | | |
|---|---|---|---|
| 6,738,922 B1 * | 5/2004 | Warwar | H03L 7/081 |
| | | | 713/500 |
| 8,948,332 B2 | 2/2015 | Kenney | |
| 9,036,764 B1 | 5/2015 | Hossain | |
| 9,413,517 B2 * | 8/2016 | Takanashi | H03L 7/10 |
| 9,806,879 B2 * | 10/2017 | Gu | H03L 7/0807 |
| 2010/0119024 A1 * | 5/2010 | Shumarayev | H03L 7/0998 |
| | | | 375/371 |
| 2012/0106689 A1 | 5/2012 | Byun | |
| 2013/0251084 A1 * | 9/2013 | Werner | H03L 7/087 |
| | | | 375/375 |
| 2015/0200768 A1 * | 7/2015 | Shibasaki | H04L 25/14 |
| | | | 375/355 |

FOREIGN PATENT DOCUMENTS

| | | |
|---|---|---|
| TW | 201338427 A | 9/2013 |
| TW | I649973 B | 2/2019 |
| WO | 2008/027066 A2 | 3/2008 |
| WO | 2008/027066 A3 | 6/2010 |

\* cited by examiner

*Primary Examiner* — Freshteh N Aghdam
(74) *Attorney, Agent, or Firm* — Winston Hsu

(57) ABSTRACT

The present invention provides a CDR circuit including a first phase detector, a controller and a phase filter. In the operations of the CDR, the first phase detector is configured to compare a phase of an input signal and a phase of a clock signal to generate a first phase detection result. The controller is configured to generate a control signal according to the first phase detection result. The phase filter is configured to receive the control signal and an auxiliary signal to generate the clock signal, wherein the auxiliary signal is generated according to the first phase detection result.

13 Claims, 4 Drawing Sheets

US 11,349,485 B2

CLOCK AND DATA RECOVERY AND ASSOCIATED SIGNAL PROCESSING METHOD

CROSS REFERENCE TO RELATED APPLICATIONS

This application claims the priority of U.S. Provisional Application No. 62/797,434, filed on Jan. 28, 2019, which is included herein by reference in its entirety.

BACKGROUND

In the conventional Digital-based (Digital-based) clock and data recovery (CDR) circuit, the loop latency is dominated by a digital controller within the Digital-based-based CDR. A speed of the digital controller is generally limited by a conventional semiconductor process, causing the Digital-based CDR circuit suffers a long loop latency issue. Therefore, the conventional Digital-based CDR circuit is not appropriate to be used in the high-speed applications.

SUMMARY

It is therefore an objective of the present invention to provide a Digital-based CDR circuit, which can reduce the overall loop latency, to solve the above-mentioned problems.

According to one embodiment of the present invention, a CDR circuit comprising a first phase detector, a controller and a phase filter is provided. In the operations of the CDR, the first phase detector is configured to compare a phase of an input signal and a phase of a clock signal to generate a first phase detection result. The controller is configured to generate a control signal according to the first phase detection result. The phase filter is configured to receive the control signal and an auxiliary signal to generate the clock signal, wherein the auxiliary signal is generated according to the first phase detection result.

According to another embodiment of the present invention, a signal processing method of a CDR circuit comprises the steps of: comparing a phase of an input signal and a phase of a clock signal to generate a phase detection result; generating a control signal according to the phase detection result; generating an auxiliary signal according to the phase detection result; and using a phase filter to receive the control signal and an auxiliary signal to generate the clock signal, wherein the phase filter has a first path for receiving the control signal to generate the clock signal, and the phase filter further has a second path to use the auxiliary signal to reduce overall latency of the CDR circuit.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
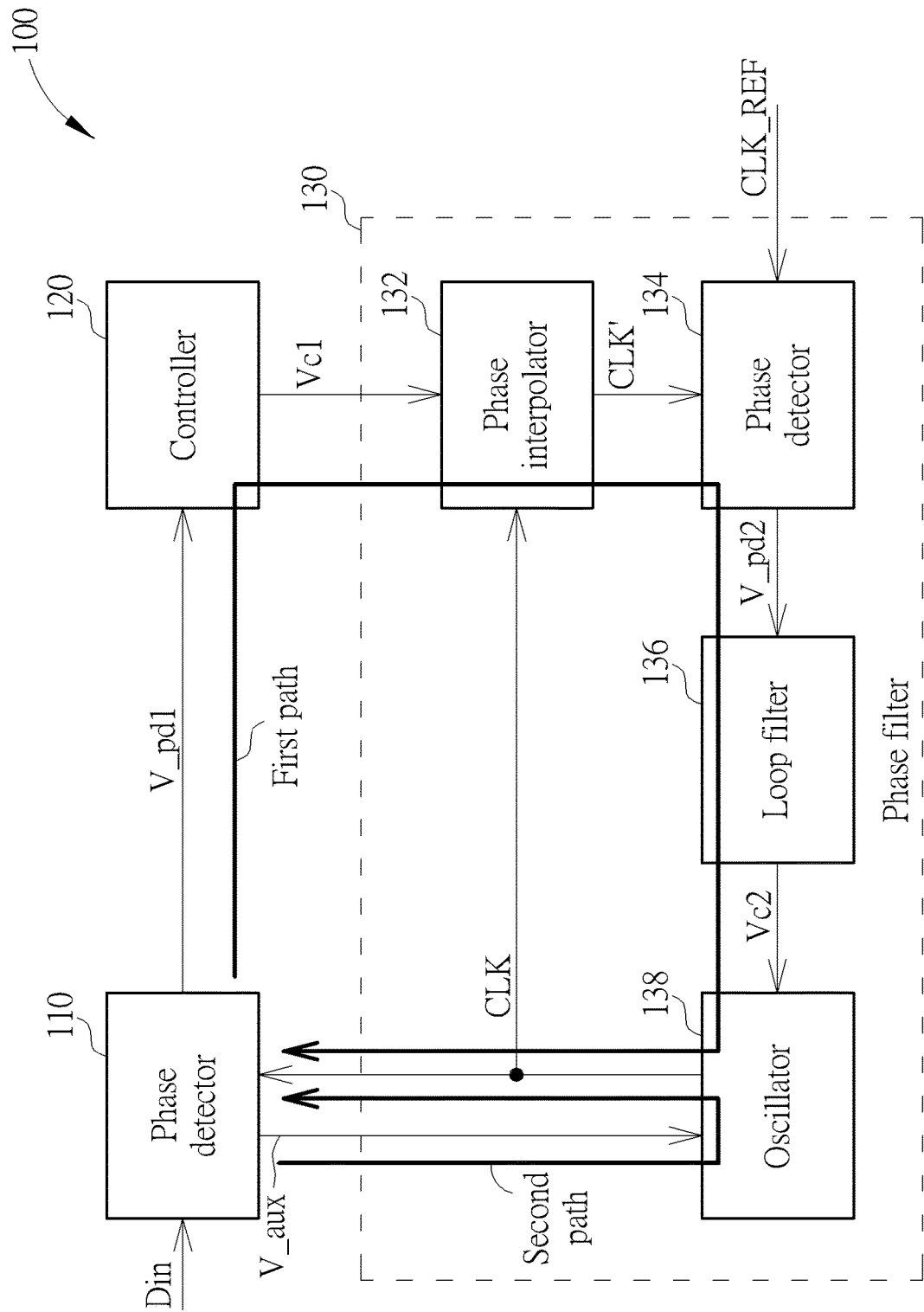
FIG. 1 is a diagram illustrating a CDR circuit according to a first embodiment of the present invention.

FIG. 1 is a diagram illustrating a CDR circuit 100 according to a first embodiment of the present invention. As shown in FIG. 1, the CDR circuit 100 comprises a phase detector 110, a controller 120 and a phase filter 130, where the phase filter 130 comprises a phase interpolator 132, a phase detector 134, a loop filter 136 and an oscillator 138. In addition, the phase detector 134 within the phase filter 130 may be replaced by a phase and frequency detector.

In the operations of the CDR circuit 100, the phase detector 110 receives an input signal (input serial data) Din and a clock signal CLK to generate a phase detection result V_pd1, wherein the phase detection result V_pd1 indicates phase information of the input signal Din and the clock signal CLK, such that the clock signal CLK is phase-lead or phase-lag to the input signal Din and/or phase difference information. Then, the controller 120, which is implemented by digital circuits, receives the phase detection result V_pd1 to generate a control signal Vc1, to control the phase interpolator 132 to adjust the phase of the clock signal CLK to generate a phase-shifted clock signal CLK'. In this embodiment, the control signal Vc1 is a digital code generate based on the phase information of the input signal Din and the clock signal CLK, and the phase interpolator 132 uses the control signal Vc1 to compensate a phase error of the clock signal CLK to generate the phase-shifted clock signal CLK'. Then, the phase detector 134 compares a phase of the phase-shifted clock signal CLK' and a phase of a reference clock signal CLK_REF to generate a phase detection result V_pd2, wherein the phase detection result V_pd2 indicates phase information (phase difference information) of the phase-shifted clock signal CLK' and the reference clock signal CLK_REF. The loop filter 136 receives the phase detection result V_pd2 to generate a filtered signal Vc2. Finally, the oscillator 138 mainly receives the filtered signal Vc2 to generate the clock signal CLK serving as an output clock signal of the CDR circuit 100.

The above-mentioned operations of the phase detector 110, the controller 120, the phase interpolator 132, the phase detector 134, the loop filter 136 and the oscillator 138 can be regarded as a first path of the CDR circuit 100. Because the speed of the controller 120 is generally limited due to the semiconductor process, the first path has a long loop latency which worsens the performance of the CDR circuit 100. To solve the long loop latency problem of the first path, the phase detector 110 further generates an auxiliary signal V_aux to the oscillator 138, for the oscillator 138 to generate the clock signal CLK based on both the filtered signal Vc2 and the auxiliary signal V_aux, to reduce the overall latency of the CDR circuit 100. In detail, the auxiliary signal V_aux may be a pulse signal indicating the phase information of the input signal Din and the clock signal CLK (e.g. the auxiliary signal V_aux may be generated based on the phase detection result V_pd1), and the oscillator 138 may refer to both the auxiliary signal V_aux and the filtered signal Vc2 to determine a frequency of the clock signal CLK (i.e. each of the auxiliary signal V_aux and the filtered signal Vc2 is able to control/adjust the frequency of the clock signal CLK).

In the embodiment shown in FIG. 1, the phase detector 110 and the oscillator 138 further form a second path that uses the auxiliary signal V_aux to adjust the phase of the clock signal CLK. Therefore, because the second path has much smaller latency, the loop latency of the first path and the overall latency of the CDR circuit 100 can be effectively reduced, and the performance of the CDR circuit 100 is therefore improved.

Figure 2:
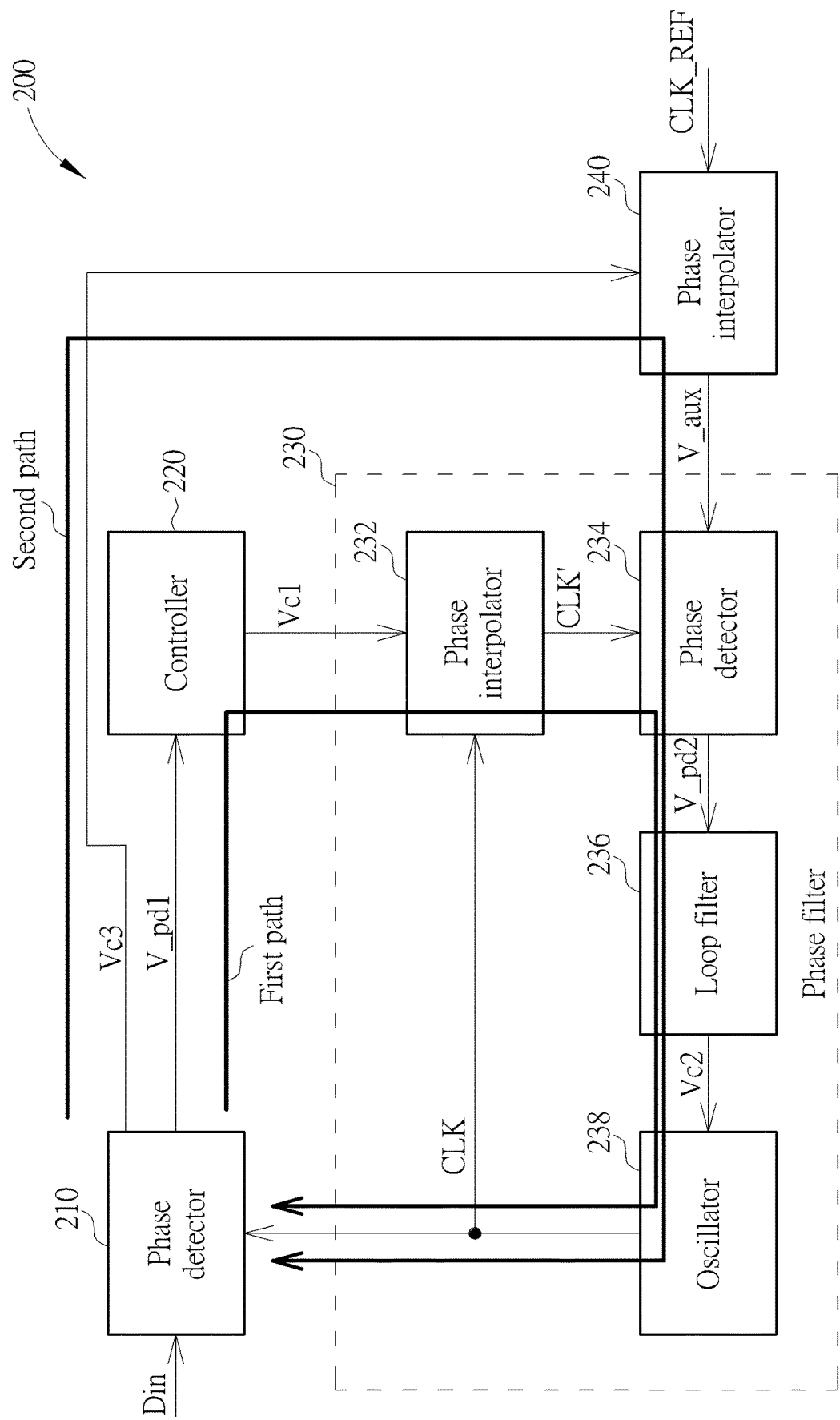
FIG. 2 is a diagram illustrating a CDR circuit according to a second embodiment of the present invention.

FIG. 2 is a diagram illustrating a CDR circuit 200 according to a second embodiment of the present invention. As shown in FIG. 2, the CDR circuit 200 comprises a phase detector 210, a controller 220, a phase filter 230 and a phase interpolator 240, where the phase filter 230 comprises a phase interpolator 232, a phase detector 234, a loop filter 236 and an oscillator 238. In addition, the phase detector 234 within the phase filter 230 may be replaced by a phase and frequency detector.

In the operations of the CDR circuit 200, the phase detector 210 receives an input signal Din and a clock signal CLK to generate a phase detection result V_pd1, wherein the phase detection result V_pd1 indicates phase information of the input signal Din and the clock signal CLK, such that the clock signal CLK is phase-lead or phase-lag to the input signal Din and/or phase difference information. Then, the controller 220, which is implemented by digital circuits, receives the phase detection result V_pd1 to generate a control signal Vc1, to control the phase interpolator 232 to adjust the phase of the clock signal CLK to generate a phase-shifted clock signal CLK'. In this embodiment, the control signal Vc1 is a digital code generate based on the phase information of the input signal Din and the clock signal CLK, and the phase interpolator 232 uses the control signal Vc1 to compensate a phase error of the clock signal CLK to generate the phase-shifted clock signal CLK'. In addition, the phase detector 210 further generates a phase control signal Vc3 to control the phase interpolator 240 to adjust a phase of a reference clock signal to generate a phase-shifted reference clock signal serving as an auxiliary signal V_aux, wherein the phase control signal Vc3 may be generated according to the phase information of the input signal Din and the clock signal CLK (e.g., the phase control signal Vc3 may be generated based on the phase detection result V_pd1). Then, the phase detector 234 compares a phase of the phase-shifted clock signal CLK' and a phase of the auxiliary signal V_aux to generate a phase detection result V_pd2, wherein the phase detection result V_pd2 indicates phase information (phase difference information) of the phase-shifted clock signal CLK' and the auxiliary signal V_aux. The loop filter 236 receives the phase detection result V_pd2 to generate a filtered signal Vc2. Finally, the oscillator 238 receives the filtered signal Vc2 to generate the clock signal CLK serving as an output clock signal of the CDR circuit 200.

The above-mentioned operations of the phase detector 210, the controller 220, the phase interpolator 232, the phase detector 234, the loop filter 236 and the oscillator 238 can be regarded as a first path of the CDR circuit 200. Because the speed of the controller 220 is generally limited due to the semiconductor process, the first path has the long loop latency which worsens the performance of the CDR circuit 200. To solve the long loop latency problem of the first path, the phase detector 210, the phase interpolator 240, the phase detector 234, the loop filter 236 and the oscillator 238 form a second path of the CDR circuit 200. In the embodiment shown in FIG. 2, because the second path can be regarded as using the auxiliary signal V_aux to adjust the phase of the clock signal CLK, and the second path has much smaller latency, the loop latency of the first path and the overall latency of the CDR circuit 200 can be effectively reduced, and the performance of the CDR circuit 200 is therefore improved.

Figure 3:
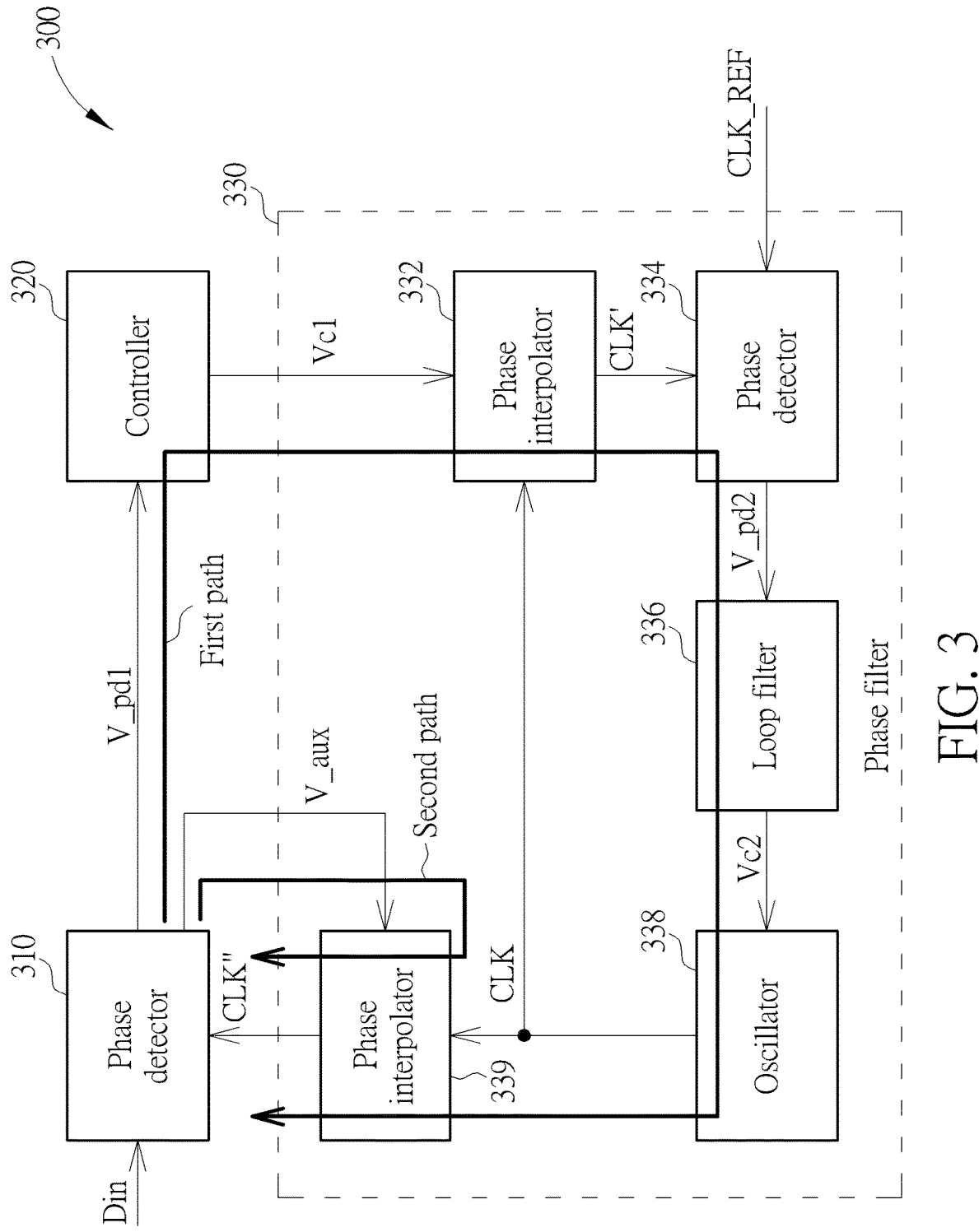
FIG. 3 is a diagram illustrating a CDR circuit according to a third embodiment of the present invention.

FIG. 3 is a diagram illustrating a CDR circuit 300 according to a third embodiment of the present invention. As shown in FIG. 3, the CDR circuit 300 comprises a phase detector 310, a controller 320 and a phase filter 330, where the phase filter 330 comprises a phase interpolator 332, a phase detector 334, a loop filter 336, an oscillator 338 and a phase interpolator 339. In addition, the phase detector 334 within the phase filter 330 may be replaced by a phase and frequency detector.

In the operations of the CDR circuit 300, the phase detector 310 receives an input signal Din and a clock signal CLK" to generate a phase detection result V_pd1, wherein the phase detection result V_pd1 indicates phase information of the input signal Din and the clock signal CLK", such that the clock signal CLK" is phase-lead or phase-lag to the input signal Din and/or phase difference information. Then, the controller 320, which is implemented by digital circuits, receives the phase detection result V_pd1 to generate a control signal Vc1, to control the phase interpolator 332 to adjust the phase of a clock signal CLK to generate a phase-shifted clock signal CLK'. In this embodiment, the control signal Vc1 is a digital code generate based on the phase information of the input signal Din and the clock signal CLK, and the phase interpolator 332 uses the control signal Vc1 to compensate a phase error of the clock signal CLK to generate the phase-shifted clock signal CLK'. Then, the phase detector 334 compares a phase of the phase-shifted clock signal CLK' and a phase of a reference clock signal REF_CLK to generate a phase detection result V_pd2, wherein the phase detection result V_pd2 indicates phase information (phase difference information) of the phase-shifted clock signal CLK' and the reference clock signal REF_CLK. The loop filter 336 receives the phase detection result V_pd2 to generate a filtered signal Vc2. The oscillator 338 receives the filtered signal Vc2 to generate the clock signal CLK serving as an output clock signal of the CDR circuit 300.

In addition, the phase detector 310 further generates an auxiliary signal V_aux to control the phase interpolator 339 to adjust a phase of a clock signal CLK to generate the clock signal CLK", wherein the auxiliary signal V_aux may be generated according to the phase information of the input signal Din and the clock signal CLK (e.g. the auxiliary signal V_aux may be generated based on the phase detection result V_pd1).

The above-mentioned operations of the phase detector 310, the controller 320, the phase interpolator 332, the phase detector 334, the loop filter 336, the oscillator 338 and the phase interpolator 339 can be regarded as a first path of the CDR circuit 300. Because the speed of the controller 320 is generally limited due to the semiconductor process, the first path has a long loop latency which worsens the performance of the CDR circuit 300. To solve the long loop latency problem of the first path, the phase detector 310 and the phase interpolator 339 form a second path of the CDR circuit 300. In the embodiment shown in FIG. 3, because the second path can be regarded as using the auxiliary signal V_aux to adjust the phase of the clock signal CLK, and the second path has much smaller latency, the loop latency of the first path and the overall latency of the CDR circuit 300 can be effectively reduced, and the performance of the CDR circuit 300 is therefore improved.

Figure 4:
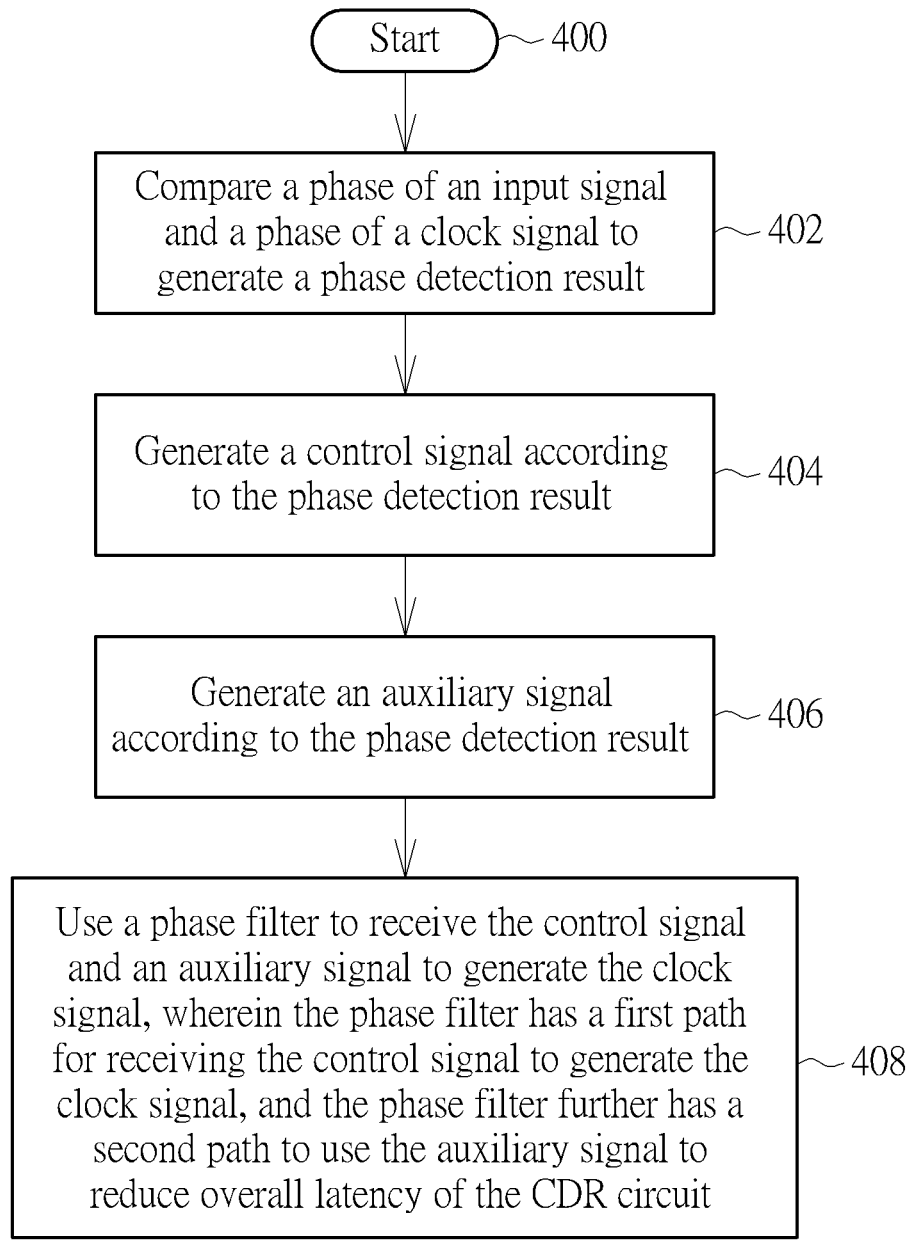
FIG. 4 shows a flowchart of a signal processing method of a CDR circuit according to one embodiment of the present invention.

FIG. 4 shows a flowchart of a signal processing method of a CDR circuit according to one embodiment of the present invention. Referring to above embodiments shown in FIGS. 1-3, the flow is described as follows.

Step 400: Start.

Step 402: compare a phase of an input signal and a phase of a clock signal to generate a phase detection result.

Step 404: generate a control signal according to the phase detection result.

Step 406: generate an auxiliary signal according to the phase detection result.

Step 408: use a phase filter to receive the control signal and an auxiliary signal to generate the clock signal, wherein the phase filter has a first path for receiving the control signal to generate the clock signal, and the phase filter further has a second path to use the auxiliary signal to reduce overall latency of the CDR circuit.

Briefly summarized, in the CDR circuit of the present invention, the CDR circuit has a first path and a second path, wherein the first path is a conventional loop having higher latency, and the second path is provided with less latency to make the overall latency of the CDR circuit be effectively reduced. Therefore, the performance of the CDR can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A clock and data recovery (CDR) circuit, comprising:
a first phase detector, configured to compare a phase of an input signal and a phase of a clock signal to generate a first phase detection result;
a controller, coupled to the first phase detector, configured to generate a control signal according to the first phase detection result; and
a phase filter, coupled to the controller, configured to receive the control signal and an auxiliary signal to generate the clock signal, wherein the auxiliary signal is generated according to the first phase detection result;
wherein the phase filter comprises:
  a phase interpolator, configured to refer to the control signal to adjust the phase of the clock signal to generate a phase-shifted clock signal;
  a second phase detector or a phase and frequency detector, coupled to the phase interpolator, configured to compare a phase of the phase-shifted clock signal and a phase of a reference clock signal to generate a second phase detection result;
  a loop filter, coupled to the second phase detector, configured to receive the second phase detection result to generate a filtered signal; and
  an oscillator, coupled to the loop filter, configured to receive the filtered signal and the auxiliary signal to generate the clock signal.

2. The CDR circuit of claim 1, wherein the auxiliary signal is a pulse signal indicating phase information of the input signal and the clock signal of the first detection result.

3. The CDR circuit of claim 2, wherein the auxiliary signal is generated by the first phase detector.

4. The CDR circuit of claim 1, wherein a frequency of the clock signal generated by the oscillator is determined by both the filtered signal and the auxiliary signal.

5. A clock and data recovery (CDR) circuit, comprising:
a first phase detector, configured to compare a phase of an input signal and a phase of a clock signal to generate a first phase detection result;
a controller, coupled to the first phase detector, configured to generate a control signal according to the first phase detection result; and
a phase filter, coupled to the controller, configured to receive the control signal and an auxiliary signal to generate the clock signal, wherein the auxiliary signal is generated according to the first phase detection result;
wherein the phase filter comprises:
a first phase interpolator, configured to refer to the control signal to adjust the phase of the clock signal to generate a phase-shifted clock signal;
a second phase detector or a phase and frequency detector, coupled to the first phase interpolator, configured to compare a phase of the phase-shifted clock signal and a phase of the auxiliary signal to generate a second phase detection result;
a loop filter, coupled to the second phase detector, configured to receive the second phase detection result to generate a filtered signal; and
an oscillator, coupled to the loop filter, configured to receive the filtered signal to generate the clock signal.

6. The CDR circuit of claim 5, further comprising:
a second phase interpolator, coupled to the first phase detector and the phase filter, configured to use a phase control signal generated based on the first phase detection result to adjust a phase of a reference clock signal to generate a phase-shifted reference clock signal serving as the auxiliary signal.

7. A clock and data recovery (CDR) circuit, comprising:
a first phase detector, configured to compare a phase of an input signal and a phase of a clock signal to generate a first phase detection result;
a controller, coupled to the first phase detector, configured to generate a control signal according to the first phase detection result; and
a phase filter, coupled to the controller, configured to receive the control signal and an auxiliary signal to generate the clock signal, wherein the auxiliary signal is generated according to the first phase detection result;
wherein the phase filter comprises:
a first phase interpolator, configured to refer to the control signal to adjust the phase of the clock signal to generate a phase-shifted clock signal;
a second phase detector or a phase and frequency detector, coupled to the first phase interpolator, configured to compare a phase of the phase-shifted clock signal and a phase of a reference clock signal to generate a second phase detection result;
a loop filter, coupled to the second phase detector, configured to receive the second phase detection result to generate a filtered signal;

an oscillator, coupled to the loop filter, configured to receive the filtered signal and the auxiliary signal to generate a first clock signal; and a second phase interpolator, coupled to the oscillator and the first phase detector, configured to refer to the auxiliary signal to adjust a phase of the first clock signal to generate the clock signal.

8. The CDR circuit of claim 7, wherein the auxiliary signal is generated by the first phase detector.

9. The CDR circuit of claim 7, wherein the first clock signal serves as an output clock signal of the CDR circuit.

10. A clock and data recovery (CDR) circuit, comprising:
a phase detector, configured to compare a phase of an input signal and a phase of a clock signal to generate a phase detection result;
a controller, coupled to the phase detector, configured to generate a control signal according to the phase detection result; and
a phase filter, coupled to the controller, configured to receive the control signal and an auxiliary signal to generate the clock signal, wherein the auxiliary signal is generated according to the phase detection result;
wherein the auxiliary signal is generated without being processed by the controller.

11. The CDR circuit of claim 10, wherein the phase filter has a first path for receiving the control signal to generate the clock signal, and the phase filter further has a second path different from the first path to use the auxiliary signal to reduce overall latency of the CDR circuit.

12. The CDR circuit of claim 10, wherein the CDR circuit comprises a first path and a second path, the first path comprises the phase detector, the controller and the phase filter, and the second path does not comprise the controller.

13. The CDR circuit of claim 12, wherein for the second path of the CDR circuit, the phase detector or a phase interpolator coupled to the phase detector directly generates the auxiliary signal to the phase filter without passing through the controller.

* * * * *